United States Patent
Lee et al.

(10) Patent No.: US 10,283,572 B2
(45) Date of Patent: May 7, 2019

(54) ORGANIC LIGHT-EMITTING DIODE DISPLAY DEVICE AND METHOD OF FABRICATING THE SAME

(71) Applicant: LG Display Co., Ltd., Seoul (KR)

(72) Inventors: Seung-Beum Lee, Gyeonggi-do (KR); Seung-Bum Lee, Gyeonggi-do (KR); Young-Hoon Kim, Gyeonggi-do (KR); Jung-Min Yoon, Gyeonggi-do (KR); Soo-In Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/383,350

(22) Filed: Dec. 19, 2016

(65) Prior Publication Data

US 2017/0194382 A1 Jul. 6, 2017

(30) Foreign Application Priority Data

Dec. 30, 2015 (KR) .................. 10-2015-0189780

(51) Int. Cl.
*H01L 27/32* (2006.01)
*H01L 51/52* (2006.01)
*H01L 51/56* (2006.01)

(52) U.S. Cl.
CPC ........ *H01L 27/322* (2013.01); *H01L 27/3213* (2013.01); *H01L 51/5246* (2013.01); *H01L 51/5253* (2013.01); *H01L 27/3244* (2013.01); *H01L 51/56* (2013.01); *H01L 2227/323* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 9,774,007 B2* | 9/2017 | Masuda | H01L 51/5259 |
| 2003/0146696 A1 | 8/2003 | Park et al. | |
| 2004/0046184 A1 | 3/2004 | Yanagawa et al. | |
| 2004/0241560 A1* | 12/2004 | Kawaguchi | G02B 5/201 430/7 |
| 2005/0248929 A1* | 11/2005 | Kawamura | H01L 27/322 362/84 |
| 2007/0035237 A1 | 2/2007 | Lee et al. | |
| 2007/0103056 A1* | 5/2007 | Cok | H01L 27/3213 313/503 |

(Continued)

FOREIGN PATENT DOCUMENTS

CN 103035664 A 4/2013

OTHER PUBLICATIONS

The First Office Action dated Feb. 1, 2018 from The State Intellectual Property Office of the People's Republic of China in related Chinese application No. 201611122147.3.

*Primary Examiner* — Lex H Malsawma
(74) *Attorney, Agent, or Firm* — Morgan, Lewis & Bockius LLP

(57) ABSTRACT

An OLED display device includes a first substrate; organic light-emitting diodes each including a first electrode, an organic light-emitting layer and a second electrode on the first substrate; a passivation layer on the organic light-emitting diodes; a second substrate spaced apart from the first substrate; a color filter layer on an inner surface of the second substrate; and a color changing layer contacting the passivation layer and the color filter layer.

22 Claims, 7 Drawing Sheets

(56) References Cited

U.S. PATENT DOCUMENTS

| | | | |
|---|---|---|---|
| 2009/0072693 A1* | 3/2009 | Cok | H01L 27/3213 |
| | | | 313/110 |
| 2010/0007270 A1* | 1/2010 | Suh | H01L 27/322 |
| | | | 313/504 |
| 2013/0082589 A1 | 4/2013 | So et al. | |
| 2014/0035960 A1 | 2/2014 | You et al. | |
| 2016/0293808 A1* | 10/2016 | Kim | H01L 33/504 |

* cited by examiner

ORGANIC LIGHT-EMITTING DIODE DISPLAY DEVICE AND METHOD OF FABRICATING THE SAME

CROSS-REFERENCE TO RELATED APPLICATION

The present application claims priority from and the benefit under 35 U.S.C § 119(a) of Korean Patent Application No. 10-2015-0189780, filed in the Republic of Korea on Dec. 30, 2015, which is hereby incorporated by reference in its entirety.

BACKGROUND

Field of the Disclosure

The present disclosure relates to an organic light-emitting diode display device, and more particularly, to an organic light-emitting diode display device capable of improving light efficiency and a color gamut and a method of fabricating the same.

Discussion of the Related Art

Recently, flat panel displays have been widely developed and applied to various fields because of their thin profile, light weight, and low power consumption.

Among the flat panel displays, organic light-emitting diode (OLED) display devices, which can be referred to as organic electroluminescent display devices, emit light during loss of electron-hole pairs. Typically, the electron-hole pairs are formed by injecting charges into a light-emitting layer between a cathode for injecting electrons and an anode for injecting holes.

The OLED display devices may be formed on a flexible substrate such as plastic. Because they are self-luminous, the OLED display devices generally have excellent contrast ratios. The OLED display devices typically have a response time of several micro seconds, and there are advantages in displaying moving images. In addition, the OLED display devices typically have wide viewing angles as they are self-luminous.

OLED display devices are generally divided into passive matrix type OLED display devices and active matrix type OLED display devices according to a driving method. Active matrix type display devices, which typically have a low power consumption and a high definition, are widely used. In addition, the size of active matrix type display devices may be large.

An OLED display device often includes a plurality of pixels, each of which includes red, green and blue sub-pixels. The red, green and blue sub-pixels include red, green and blue organic light-emitting layers, respectively. Red, green and blue lights emitted from the sub-pixels are mixed to produce an image.

The red, green and blue organic light-emitting layers are typically formed of different materials and have different properties. Because of this, the red, green and blue sub-pixels have different light efficiencies and different lifetimes, which may lead to problems. To solve such problems, an OLED display device including color filters has been suggested.

In such a solution, each pixel typically includes red, green and blue sub-pixels, and each of the red, green and blue sub-pixels includes an organic light-emitting layer emitting the same color light. For example, the organic light-emitting layer of each of the sub-pixels emits white light. The red, green and blue sub-pixels further include red, green and blue color filters, respectively. Therefore, the white light emitted from each sub-pixel passes through the red, green and blue color filters, and red, green and blue lights are outputted. The red, green and blue lights are mixed to thereby produce an image. At this time, to express exact colors, it may be necessary to match colors of the white light emitted from the organic light-emitting layers and the color filters.

Particularly, color filters have been widely used for liquid crystal display (LCD) devices. But white light emitted from a light source for an LCD device has red, green, and blue peaks and band widths different from the white light emitted from the organic light-emitting layers of an OLED display device. Thus, there may be a problem of low color gamut when general color filters, such as those used for LCD devices, are applied to an OLED display device. Also, because the color filters absorb light having different wavelengths, light efficiencies are decreased.

Meanwhile, to increase the color gamut and the light efficiency of the OLED display device including color filters, a structure including a color changing layer on the color filters has been suggested. The color changing layer absorbs short wavelength light and emits long wavelength light. Different color changing patterns are typically formed on the red, green and blue color filters. That is, a red color changing pattern may be formed on the red color filter. A green color changing pattern or a yellow color changing pattern maybe be formed on the green color filter. A blue color changing pattern or no color changing pattern may be formed on the blue color filter.

Therefore, the OLED display device including the color changing layer may need at least two photolithography processes in order to form the different color changing patterns on the different color filters. The photolithography process for pattering a thin film may include a plurality of steps of coating a photosensitive material, light-exposing the photosensitive material using a mask, developing the photosensitive material, curing the photosensitive material, and so on. Thus, the OLED display device including the color changing layer may have a wide color gamut, but its manufacturing time and costs are increased.

SUMMARY

Accordingly, one aspect of the present disclosure is to provide an OLED display device that substantially obviates one or more of the problems due to limitations and disadvantages of the related art.

An object of the present disclosure is to provide an OLED display device that improves the color gamut and light efficiency while avoiding an increase in manufacturing time and costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an organic light-emitting diode display device. In one aspect, an OLED display device includes a first substrate; organic light-emitting diodes each including a first electrode, an organic light-emitting layer, and a second electrode on the first substrate; a passivation layer on the organic light-emitting diodes; a second substrate spaced apart from the first substrate; a color filter layer on an inner surface of the second substrate; and a color changing layer contacting the passivation layer and the color filter layer.

In another aspect, an OLED display device includes a first substrate; organic light-emitting diodes each including a first electrode, an organic light-emitting layer, and a second electrode on the first substrate; a passivation layer on the organic light-emitting diodes; a second substrate spaced apart from the first substrate; a color filter layer on an inner surface of the second substrate and including red, green, and blue color filters; and a color changing layer overlapping the red and green color filters, the color changing layer absorbing blue light and emitting yellow light therefrom.

In another aspect, a method of fabricating an OLED display device includes preparing a first substrate including organic light-emitting diodes and a passivation layer on the organic light-emitting diodes; preparing a second substrate including a color filter layer; forming a filling layer on one of the first and second substrates by applying a filling substance including a color conversion material; attaching the first and second substrates with the filling layer therebetween; and forming a color changing layer by curing the filling layer between the first and second substrates, the color changing layer contacting the passivation layer and the color filter layer.

Further scope of applicability of the present invention will become apparent from the detailed description given hereinafter. However, the detailed description and specific examples, while indicating example embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the embodiments of the disclosure, examples of which are illustrated in the accompanying drawings. Words of 'on' and 'under' are used only for describing a direction in the following explanations and thus are not limited to 'directly on' and 'directly under'.

Figure 1:
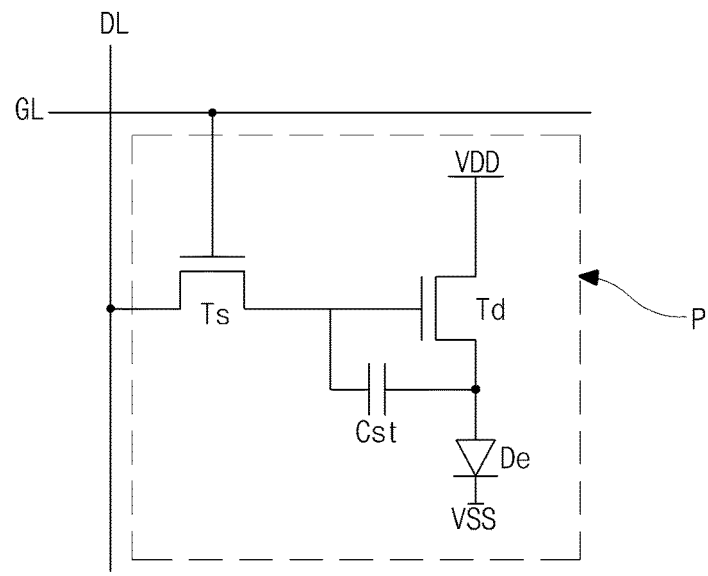
FIG. 1 is a circuit diagram of one pixel region of an OLED display device according to an example embodiment of the present disclosure.

FIG. 1 is a circuit diagram of one pixel region of an OLED display device according to an example embodiment of the present disclosure.

As shown in FIG. 1, the OLED display device according to an embodiment of the present disclosure includes a gate line GL, a data line DL, a switching thin film transistor Ts, a driving thin film transistor Td, a storage capacitor Cst and an organic light-emitting diode De. The gate line GL and the data line DL cross each other to define a pixel region P. The switching thin film transistor Ts, the driving thin film transistor Td, the storage capacitor Cst and the organic light-emitting diode De are formed in the pixel region P.

For example, a gate electrode of the switching thin film transistor Ts is connected to the gate line GL, and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the organic light-emitting diode De is connected to a drain electrode of the driving thin film transistor Td, and a cathode of the organic light-emitting diode De is connected to a low voltage supply VSS. The storage capacitor Cst is connected to the gate electrode and the drain electrode of the driving thin film transistor Td.

The OLED display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the organic light-emitting diode De is controlled, thereby displaying an image. The organic light-emitting diode De emits light due to the current supplied through the driving thin film transistor Td from the high voltage supply VDD.

Namely, the amount of the current flowing through the organic light-emitting diode De is proportional to the magnitude of the data signal, and the intensity of light emitted by the organic light-emitting diode De is proportional to the amount of the current flowing through the organic light-emitting diode De. Thus, the pixel regions P show different gray levels depending on the magnitude of the data signal, and as a result, the OLED display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the organic light-emitting diode De to be constant and the gray level shown by the organic light-emitting diode De to be maintained until a next frame.

However, the OLED display device according to an embodiment of the present disclosure is not limited to the illustrated example. For example, alternatively, at least one thin film transistor, at least one signal line and/or at least one capacitor for compensation may be further formed in each pixel region.

Figure 2:
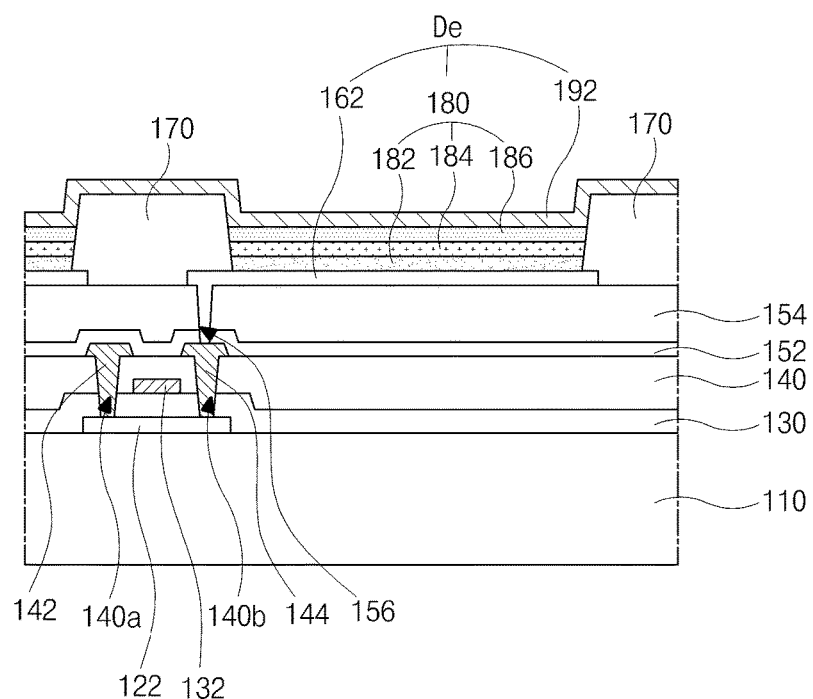
FIG. 2 is a cross-sectional view of an OLED display device according to an example embodiment of the present disclosure and shows a pixel region.

FIG. 2 is a cross-sectional view of an OLED display device according to an example embodiment of the present disclosure and shows a pixel region.

In FIG. 2, a semiconductor layer 122 is patterned and formed on an insulating substrate 110. The substrate 110 may be a glass substrate or a plastic substrate. The semiconductor layer 122 may be formed of an oxide semiconductor material. In the OLED display device including the semiconductor layer 122 formed of an oxide semiconductor material, a light-blocking pattern and a buffer layer may be formed under the semiconductor layer 122. The light-blocking pattern blocks light from the outside or light emitted from a light-emitting diode to prevent the semiconductor layer 122 from being degraded by the light. Alternatively, the semiconductor layer 122 may be formed of polycrystalline silicon, and in this case, impurities may be doped in both sides of the semiconductor layer 122.

A gate insulating layer 130 of an insulating material is formed on the semiconductor layer 122 over substantially all of the substrate 110. The gate insulating layer 130 may be formed of an inorganic insulating material such as silicon oxide ($SiO_2$). When the semiconductor layer 122 is formed of polycrystalline silicon, the gate insulating layer 130 may be formed of silicon oxide ($SiO_2$) or silicon nitride (SiNx).

A gate electrode 132 made of a conductive material such as metal may be formed on the gate insulating layer 130 to correspond to the semiconductor layer 122. In addition, a gate line and a first capacitor electrode may be formed on the gate insulating layer 130. The gate line extends in a first direction, and the first capacitor electrode may be connected to the gate electrode 132.

The OLED display device according to an embodiment of the present disclosure includes the gate insulating layer 130 formed over substantially all of the substrate 110. Alternatively, the gate insulating layer 130 may be patterned to have the same shape as the gate electrode 132.

Further, an inter insulating layer 140 of an insulating material is formed on the gate electrode 132 over substantially all of the substrate 110. The inter insulating layer 140 may be formed of an inorganic insulating material such as silicon oxide ($SiO_2$) or silicon nitride (SiNx) or an organic insulating material such as benzocyclobutene or photo acryl.

In addition, the inter insulating layer 140 includes first and second contact holes 140a and 140b exposing top surfaces of both sides of the semiconductor layer 122. The first and second contact holes 140a and 140b are spaced apart from the gate electrode 132, and the gate electrode 132 is disposed between the first and second contact holes 140a and 140b. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the inter insulating layer 140.

A source electrode 142 and a drain electrode 144 of a conductive material such as metal are formed on the inter insulating layer 140. In addition, a data line, a power supply line and a second capacitor electrode may be formed on the inter insulating layer 140. The data line and the power supply line extend in a second direction.

Further, the source and drain electrodes 142 and 144 are spaced apart from each other with respect to the gate electrode 132. The source and drain electrodes 142 and 144 contact both sides of the semiconductor layer 122 through the first and second contact holes 140a and 140b, respectively. The data line may cross the gate line to define the pixel region. In addition, the power supply line supplying a high level voltage may be spaced apart from the data line. The second capacitor electrode may be connected to the drain electrode 144 and may overlap the first capacitor electrode to form a storage capacitor with the inter insulating layer 140 therebetween as a dielectric substance.

As shown in FIG. 2, in the OLED display device, a thin film transistor includes the semiconductor layer 122, the gate electrode 132, the source electrode 142 and the drain electrode 144. The thin film transistor may have a coplanar structure where the gate electrode 132 and the source and drain electrodes 142 and 144 are disposed at a side of the semiconductor layer 122, e.g., over the semiconductor layer 122.

Alternatively, the thin film transistor may have an inverted staggered structure where the gate electrode is disposed under the semiconductor layer and the source and drain electrodes are disposed over the semiconductor layer. In such an example, the semiconductor layer may be formed of amorphous silicon.

In addition, the thin film transistor may be a driving thin film transistor of the OLED display device. A switching thin film transistor may have the same structure as the driving thin film transistor formed over the substrate 110. In such an example, the gate electrode 132 of the driving thin film transistor is connected to a drain electrode of the switching thin film transistor, and the source electrode 142 of the driving thin film transistor is connected to the power supply line. In addition, the gate electrode and the source electrode of the switching thin film transistor are connected to the gate line and the data line, respectively.

A first passivation layer 152 and a second passivation layer 154 of insulating materials are sequentially formed on the source and drain electrodes 142 and 144 over substantially all of the substrate 110. The first passivation layer 152 may be formed of an inorganic insulating material such as silicon oxide ($SiO_2$) or silicon nitride (SiNx), and the second passivation layer 154 may be formed of an organic insulating material such as benzocyclobutene or photo acryl. The second passivation layer 154 can have a flat top surface.

Further, the first passivation layer 152 and the second passivation layer 154 have a drain contact hole 156 exposing the drain electrode 144. In FIG. 2, although the drain contact hole 156 is formed directly over the second contact hole 140b, the drain contact hole 156 may be spaced apart from the second contact hole 140b.

One of the first passivation layer 152 and the second passivation layer 154 may be omitted. For example, the first passivation layer 152 of an inorganic insulating material may be omitted.

A first electrode 162 of a conductive material having a relatively high work function is formed on the second passivation layer 154. The first electrode 162 is disposed in each pixel region and contacts the drain electrode 144 through the drain contact hole 156. For example, the first electrode 162 may be formed of a transparent conductive material, such as indium tin oxide (ITO) and indium zinc oxide (IZO).

A bank layer 170 of an insulating material is formed on the first electrode 162. The bank layer 170 is disposed between adjacent pixel regions, has an opening exposing the first electrode 162, and covers edges of the first electrode 162.

In the illustrated OLED display device, the bank layer 170 has a single-layered structure. However, the structure of the bank layer 170 is not limited to this example. For example, the bank layer may have a double-layered structure. That is, the bank layer 170 may include a first bank and a second bank on the first bank, and the first bank may have a wider width than the second bank. In such an example, the first bank may be formed of an inorganic insulating material or organic insulating material having a hydrophilic property, and the second bank may be formed of an organic insulating material having a hydrophobic property.

In addition, a light-emitting layer 180 is formed on the first electrode 162 exposed by the opening of the bank layer 170. The light-emitting layer 180 includes a hole auxiliary layer 182, a light-emitting material layer (EML) 184, and an electron auxiliary layer 186, which are sequentially disposed from a top surface of the first electrode 162.

In more detail, the hole auxiliary layer 182, the light-emitting material layer 184 and the electrode auxiliary layer 186 may be formed of organic materials and may be formed through a solution process, which may be referred to as a soluble process. Accordingly, the manufacturing processes may be simplified, and a display device having a large size and high definition may be provided. One of a spin coating method, an inkjet printing method and a screen printing method may be used for the solution process.

Alternatively, the hole auxiliary layer 182, the light-emitting material layer 184 and the electrode auxiliary layer 186 may be formed through a vacuum evaporation process. In addition, the hole auxiliary layer 182, the light-emitting material layer 184 and the electrode auxiliary layer 186 may be formed by a combination of the solution process and the vacuum evaporation process.

The hole auxiliary layer 182 may include at least one of a hole injecting layer (HIL) and a hole transporting layer (HTL), and the electron auxiliary layer 186 may include at least one of an electron injecting layer (EIL) and an electrode transporting layer (ETL).

As illustrated in FIG. 2, the hole auxiliary layer 182, the light-emitting material layer 184 and the electron auxiliary layer 186 are formed on the first electrode 162 surrounded by the bank layer 170. However, the hole auxiliary layer 182, the light-emitting material layer 184 and the electron auxiliary layer 186 may be formed over substantially all the substrate 110. For example, the hole auxiliary layer 182, the light-emitting material layer 184 and the electron auxiliary layer 186 may be further formed on side and upper surfaces of the bank layer 170. Meanwhile, in some embodiments, the bank layer 170 may be omitted.

A second electrode 192 of a conductive material having relatively low work function is formed on the electron auxiliary layer 186 over substantially all of the substrate 110. In an example, the second electrode 192 may be formed, for example, of aluminum (Al), magnesium (Mg), silver (Ag), or their alloy(s).

The first electrode 162, the light-emitting layer 180 and the second electrode 192 constitute an organic light-emitting diode De. In an example, the first electrode 162 functions as an anode, and the second electrode 192 serves as a cathode.

As illustrated in FIG. 2, the OLED display device according to an embodiment of the present disclosure is an active matrix type and is a top emission type in which light from the light-emitting material layer 184 is outputted to the outside through the second electrode 192. In this case, the first electrode 162 may further include a reflection layer formed of an opaque conductive material. For example, the reflection layer may be formed of aluminum-paladium-copper (APC) alloy, and the first electrode 162 may have a triple-layered structure of ITO/APC/ITO. In addition, the second electrode 192 may have a relatively thin thickness such that light is transmitted therethrough. For example, the second electrode 192 may have transmittance of about 45% to 50%.

Alternatively, the OLED display device according to an embodiment of the present disclosure may be a both-sides emission type in which light from the light-emitting material layer 184 is outputted to the outside through the first and second electrodes 162 and 192.

The OLED display device according to an embodiment of the present disclosure includes a plurality of pixels, and each pixel includes red, green and blue sub-pixels. The thin film transistor and the organic light-emitting diode of FIG. 2 are formed in each red, green and blue sub-pixel region. In addition, red, green and blue color filters are further formed in the red, green and blue sub-pixel regions, respectively. This will be described in more detail with reference to accompanying drawings.

Figure 3:
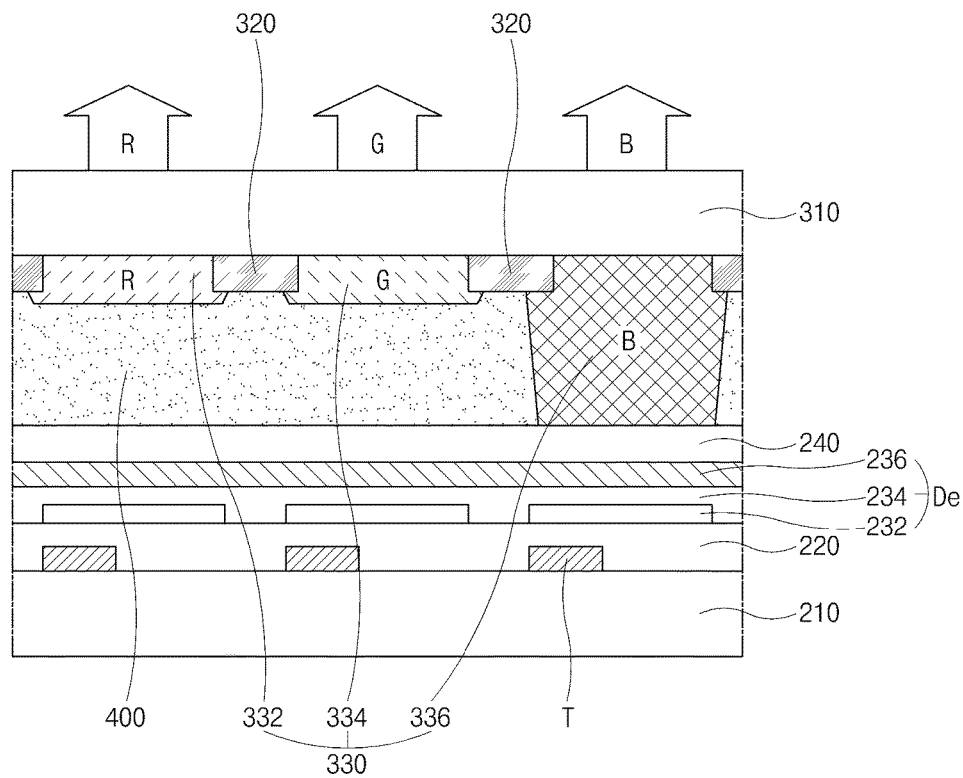
FIG. 3 is a view of an OLED display device according to an example embodiment of the present disclosure and shows a pixel.

FIG. 3 is a schematic view of an OLED display device according to an example embodiment of the present disclosure and shows a pixel. Here, the pixel includes red, green and blue sub-pixels, and each sub-pixel has a structure corresponding to the pixel region shown in FIG. 1 and FIG. 2.

In FIG. 3, the OLED display device according to the embodiment of the present disclosure includes a first substrate 210, thin film transistors T, an insulating layer 220, organic light-emitting diodes De, a passivation layer 240, a second substrate 310, a black matrix 320, a color filter layer 330, and a color changing layer 400.

The first and second substrates 210 and 310 are spaced apart from and face each other, and light emitted from the organic light-emitting diodes De is outputted to the outside through the second substrate 310. At this time, the second substrate 310 is formed of a transparent material. For example, the second substrate 310 may be formed of glass or plastic.

The thin film transistor T is formed in each pixel region on an inner surface of the first substrate 210. The thin film transistor T includes a switching thin film transistor and a driving thin film transistor, and each of the switching and driving thin film transistors includes a gate electrode, a semiconductor layer, a source electrode and a drain electrode.

In addition, although not shown in FIG. 3, a gate line and a data line connected to the switching thin film transistor and a storage capacitor connected to the switching and driving thin film transistors are further formed on the inner surface of the first substrate 210.

The insulating layer 220 is formed on the thin film transistors T and covers the thin film transistors T. In this example, the insulating layer 220 may be a single-layered structure of an inorganic film or an organic film or a double-layered structure of an inorganic film and an organic film.

The organic light-emitting diodes De are formed on the insulating layer 220, and each organic light-emitting diode De includes a first electrode 232, an organic light-emitting layer 234 and a second electrode 236.

In this example, the first electrode 232 may function as an anode and may be formed of a conductive material having a relatively high work function. The second electrode 236 may function as a cathode and may be formed of a conductive material having a relatively low work function. For example, the first electrode 232 may include a transparent electrode formed of a transparent conductive material such as indium tin oxide (ITO) or indium zinc oxide (IZO), and the first electrode 232 may further include a reflective layer of an opaque conductive material under the transparent electrode. The second electrode 236 may be formed of aluminum, magnesium, silver, or their alloy(s) and may have a relatively thin thickness such that light passes through the second electrode 236. Here, light emitted from the organic light-emitting layer 234 is outputted through the outside.

The first electrode 232 is patterned by pixel regions and is connected to the thin film transistor T in each pixel region. The second electrode 236 is formed over substantially all the first substrate 210.

The organic light-emitting layer 234 is disposed between the first electrodes 232 and the second electrode 236. The organic light-emitting layer 234 may have a multiple-layered structure of a hole transporting layer, a light-emitting material layer, and an electron transporting layer sequentially layered on the first electrode 232. In addition, the organic light-emitting layer 234 may further include a hole injection layer between the first electrode 232 and the hole transporting layer and an electron injecting layer between the electron transporting layer and the second electrode 236.

The organic light-emitting layer 234 in each pixel region emits the same color light, for example, white light.

The passivation layer 240 is formed on the organic light-emitting diode De to protect the organic light-emitting diode De from moisture and oxygen from the outside. The passivation layer 240 may have a single-layered structure of an inorganic film and may be formed of silicon oxide ($SiO_2$), for example. Alternatively, the passivation layer 240 may have a multiple-layered structure of inorganic films and organic films alternating with each other.

The passivation layer 240 is formed over substantially all the first substrate 210. Although not shown in the figure, the passivation layer 240 may cover a side surface of the organic light-emitting diode De and may directly contact side surfaces of the organic light-emitting layer 243 and the second electrode 236. Meanwhile, the second substrate 310 is disposed over and spaced apart from the passivation layer 240.

The black matrix 320 is formed on an inner surface of the second substrate 310. The black matrix 320 corresponds to a boundary between adjacent pixel regions and has openings corresponding to respective pixel regions. The black matrix 320 may be formed of a black resin or may be formed of chromium oxide (CrOx) and chromium (Cr) to have double layers.

The color filter layer 330 is formed on the black matrix 320. The color filter layer 330 includes red, green and blue color filters 332, 334, 336 corresponding to the red, green and blue sub-pixels. The blue color filter 336 has a thickness larger than the red color filter 332 and the green color filter 334. The thickness of the blue color filter 336 may be more than twice, beneficially, 3.5 times to 5 times, the red and green color filters 332 and 334. Here, the red and green color filters 332 and 334 may have the same thickness. For example, the thicknesses of the red and green color filters 332 and 334 may be about 2 micrometers, and the thickness of the blue color filter 336 may be about 7 micrometers to 10 micrometers. The blue color filter 336 may substantially contact the passivation layer 240 of the first substrate 210.

The color changing layer 400 is disposed between the passivation layer 240 of the first substrate 210 and the color filter layer 330 of the second substrate 310. For example, the color changing layer 400 is disposed between the red and green color filters 332 and 334 and the passivation layer 240. The color changing layer 400 covers the red and green color filters 332 and 334 and contacts the passivation layer 240 to fill a gap between the first substrate 210 and the second substrate 310. The color changing layer 400 may include a material having relatively low hygroscopic property to prevent moisture and oxygen penetration.

Here, the color changing layer 400 may have a predetermined thickness for improving light efficiency and a color gamut, and a color shift may occur according to viewing angles when the color changing layer 400 is too thick. Therefore, the color changing layer 400 may have a thickness more than twice the red color filter 332 or the green color filter 334, and beneficially, the thickness of the color changing layer 400 may be 2.5 times to 4 times the red color filter 332 or the green color filter 334. For example, the thicknesses of the red and green color filters 332 and 334 may be about 2 micrometers, and the thickness of the color changing layer 400 may be more than about 4 micrometers, and beneficially, about 5 micrometers to 8 micrometers.

The color changing layer 400 has properties of absorbing light and emitting light and includes a color conversion material, which absorbs short wavelength light, shifts the short wavelength light into long wavelength light and emits the long wavelength light. Here, the color conversion material may be a yellow color conversion material absorbing blue light and emitting yellow light.

The color conversion material may have a nanometer size that does not cause Rayleigh scattering and may be a fluorescent dye that has high optical properties after being formed for patterning, that is, has high peak wavelength and intensity. For instance, the yellow color conversion material may be a coumarin fluorescent dye or a perylene fluorescent dye.

Alternatively, the color conversion material may be a quantum dot, which is a semiconductor nano crystal having a nanometer size, has a changeable energy band gap depending on its size and shape, and has a high emission property and narrow emission line width. The quantum dot may include a core nano crystal and a shell nano crystal surrounding the core nano crystal.

For example, the quantum dot may include at least one of II group compound semiconductors, III group compound semiconductors, V group compound semiconductors, and VI group compound semiconductors. More specifically, the core nano crystal may include CdSe, InGaP, CdTe, CdS, ZnSe, ZnTe, ZnS, HgTe, or HgS. The shell nano crystal may include CuZnS, CdSe, CdTe, CdS, ZnSe, ZnTe, ZnS, HgTe, or HgS. The quantum dot may have a diameter of 1 nanometer to 10 nanometers.

Moreover, the color changing layer 400 may further include an acryl resin or an epoxy resin, and may further include additives such as an initiator or monomers. In this example, the content of the color conversion material may be 1 wt % to 5 wt % based on the total content of materials of the color changing layer 400.

Although not shown in FIG. 3, a seal pattern may be formed in edge areas between the first and second substrates 210 and 310 to attach the first and second substrates 210 and 310 and to prevent moisture and oxygen penetration from the outside. The seal pattern may be formed of a sealing material, which may be cured by UV.

In the red sub-pixel of the OLED display device according to an embodiment of the present invention, red light R of white light W emitted from the organic light-emitting diode De passes through the color changing layer 400 and the red color filter 332 and is outputted to the outside, and green light G passes through the color changing layer 400 and is absorbed by the red color filter 332. On the other hand, blue light B is converted into yellow light Y while passing through the color changing layer 400 and is provided to the red color filter 332. Light within a green wavelength range of the yellow light Y is absorbed by the red color filter 332, and light within a red wavelength range of the yellow light Y passes through the red color filter 332 and is outputted to the outside. Accordingly, red light R with improved color purity and light efficiency is finally outputted.

Meanwhile, in the green sub-pixel, a red light R component of white light W emitted from the organic light-emitting diode De passes through the color changing layer 400 as it is and is absorbed by the green color filter 334, and green light G passes through the color changing layer 400 and the green color filter 334 as it is and is outputted to the outside. On the other hand, blue light B is converted into yellow light Y while passing through the color changing layer 400 and is provided to the green color filter 334. Light within a red wavelength range of the yellow light Y is absorbed by the green color filter 334, and light within a green wavelength range of the yellow light Y passes through the green color filter 334 and is outputted to the outside. Accordingly, green light G with improved color purity and light efficiency is finally outputted.

Additionally, in the blue sub-pixel, red light R and green light G of white light W emitted from the organic light-emitting diode De are absorbed by the blue color filter 336, and blue light B passes through the blue color filter 336 and is outputted to the outside.

As a first example of the OLED display device according to an embodiment of the present disclosure, when the content of the yellow color conversion material is 1.00 wt % and the thickness of the color changing layer is 5.5 micrometers, in the CIE xyY color space, red coordinates are (0.669, 0.329) and red luminance is 0.866, and green coordinates are (0.321, 0.641) and green luminance is 3.192. Moreover, as a second example, when the content of the yellow color conversion material is 1.50 wt % and the thickness of the color changing layer is 6.1 micrometers, red coordinates are (0.670, 0.329) and red luminance is 0.878, and green coordinates are (0.325, 0.642) and green luminance is 3.182. In this example, in the CIE (International Commission on Illumination) 1976 chromaticity diagram, the first example has a color gamut of about 113.3% and an overlap ratio of about 89.4% with respect to DCI (digital cinema initiative) color standard, and the second example has a color gamut of about 113.1% and a DCI overlap ratio of about 89.2%.

Meanwhile, as a comparative example, in an OLED display device without a color changing layer, red coordinates are (0.668, 0.328), red luminance is 0.836, green coordinates are (0.317, 0.635), and green luminance is 3.060. The comparative example has a color gamut of about 112.9% and a DCI overlap ratio of about 89.1%.

Accordingly, the first example has red luminance increased by about 3.6%, green luminance increased by about 4.3%, color gamut increased by about 0.4%, and DCI overlap ratio increased by about 0.3% as compared with the comparative example. In addition, the second example has the red luminance increased by about 5.0%, the green luminance increased by about 4.0%, the color gamut increased by about 0.2%, and the DCI overlap ratio increased by about 0.1% as compared with the comparative example.

Therefore, according to an example embodiment of the present invention, the OLED display device includes the color changing layer 400 overlapping the red and green color filters 332 and 334, and the color gamut and the light efficiency are increased.

In an example embodiment of the present invention, the color conversion material is the yellow color conversion material, as an example. Alternatively, the color conversion material may include a red color conversion material absorbing blue light and emitting red light and a green color conversion material absorbing blue light and emitting green light.

Additionally, in an example embodiment of the present disclosure, one pixel includes the red, green and blue sub-pixels. Alternatively, one pixel may include red, green, blue and white sub-pixels. The color filter layer may further include a white color filter corresponding to the white sub-pixel, and the white color filter may be a transparent insulating pattern. It may be beneficial that the white color filter has the same thickness as the blue color filter and transmits white light W as it is.

In example embodiments of the present disclosure, because the color changing layer 400 may be formed without an additional photolithography process for patterning it, the manufacturing processes may be simplified and the manufacturing time and costs may be reduced. The method of fabricating the OLED display device according to an embodiment of the present disclosure will be described in detail with reference to accompanying drawings.

FIGS. 4A to 4E are cross-sectional views illustrating a method of fabricating an OLED display device according to a first example embodiment of the present disclosure.

Figure 4A:
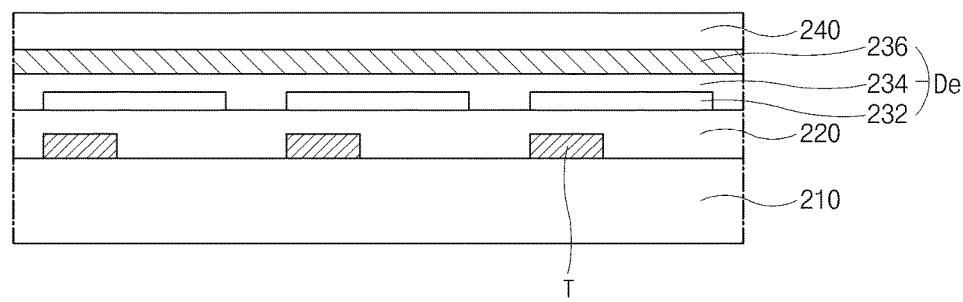
FIGS. 4A to 4E are cross-sectional views illustrating a method of manufacturing an OLED display device according to a first example embodiment of the present disclosure.

In FIG. 4A, a first substrate 210 is prepared on which thin film transistors T, an insulating layer 220, organic light-emitting diodes De, and a passivation layer 240 are formed.

For example, the thin film transistors T each including a gate electrode (not shown), a semiconductor layer (not shown), and source and drain electrodes (not shown) are formed in respective sub-pixels on the first substrate 210 by repeating steps of depositing a thin film and patterning the thin film through a photolithography process. Then, the insulating layer 220 is formed on the thin film transistors T by a deposition method or a coating method, and contact holes (not shown) exposing the drain electrodes of the thin film transistors T are formed by patterning the insulating layer 220 through a photolithography process. Next, the first electrodes 232 are formed on the insulating layer 220 by depositing a first conductive material by a sputtering method and patterning the first conductive material through a photolithography process. The first electrodes 232 contact the drain electrodes of the thin film transistors T through the contact holes. Here, the first conductive material may include a material having relatively high work function. Next, an organic light-emitting layer 234 is formed on the first electrodes 232. The organic light-emitting layer 234 may include a hole auxiliary layer, a light-emitting material layer, and an electron auxiliary layer. The organic light-emitting layer 234 may be formed over substantially all the first substrate 210. Alternatively, the organic light-emitting layer 234 may be patterned by the sub-pixels. Then, a second electrode 236 is formed over substantially all the first substrate 210 by depositing a second conductive material on the organic light-emitting layer 234 by a sputtering method. The second electrode 236 may include a material having a substantially low work function. Here, the first electrode 232, the organic light-emitting layer 234 and the second electrode 236 constitute the organic light-emitting diode De. Next, the passivation layer 240 is formed over substantially all on the first substrate 210 by depositing or applying an insulating material on the second electrode 236. The passivation layer 240 covers the organic light-emitting diode De and protects the organic light-emitting diode De from moisture or oxygen. At this time, the passivation layer 240 may contact a side surface of the second electrode 236 as well as an upper surface of the second electrode 236. In addition, the passivation layer 240 may contact a side surface of the organic light-emitting layer 234.

Figure 4B:
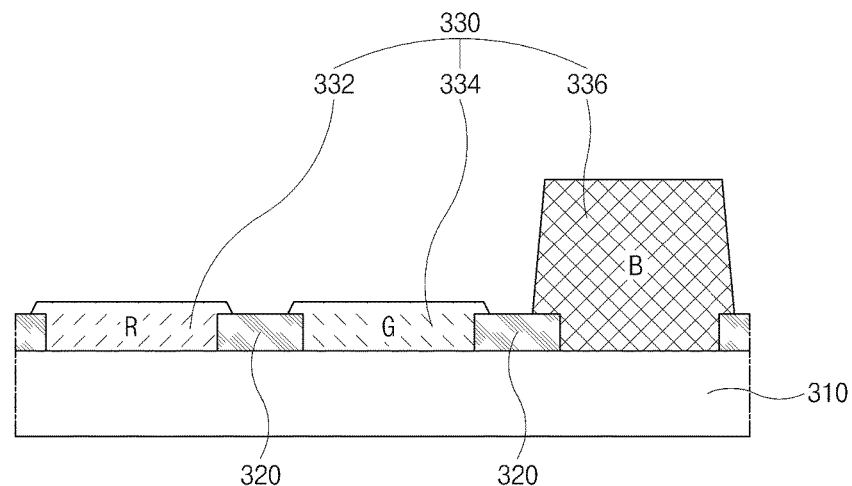

Next, in FIG. 4B, a second substrate 310 is prepared on a black matrix 320 and a color filter layer 330.

For example, a light-blocking material layer (not shown) is formed on the second substrate 310 and is patterned through a photolithography process to thereby form the black matrix 320 having openings corresponding to the respective sub-pixels. Here, the light-blocking material layer may include a black resin or may include double layers of chromium oxide (CrOx) and chromium (Cr). Next, a red color filter 332 is formed in a red sub-pixel by applying a first color filter material having a photosensitive property, for example, a red color filter material, over substantially all the second substrate 310 on the black matrix 320, drying the red color filter material, light-exposing the red color filter material using a mask, developing the red color filter material, and curing the red color filter material. Then, a green color filter 334 is formed in a green sub-pixel by applying a second color filter material having a photosensitive property, for example, a green color filter material, over substantially all the second substrate 310 on the black matrix 320 and the red color filter 332, drying the green color filter material, light-exposing the green color filter material using a mask, developing the green color filter material, and curing the green color filter material. Next, a blue color filter 336 is formed in a blue sub-pixel by applying a third color filter material having a photosensitive property, for example, a blue color filter material, over substantially all the second substrate 310 on the black matrix 320, the red color filter 332 and the green color filter 334, drying the blue color filter material, light-exposing the blue color filter material using a mask, developing the blue color filter material, and curing the blue color filter material. Accordingly, the color filter layer 330 including the red, green and blue color filters 332, 334 and 336 may be completed. However, the formation order of the red, green and blue color filters 332, 334 and 336 may be changed. It may be beneficial that a thickness of the blue color filter 336 is larger than thicknesses of the red and green color filters 332 and 334.

Here, the red, green and blue color filter materials may be applied by a coating method, and for example, one of a spin coating method, a slit coating method, a bar coating method, a roll coating method, an inkjet coating method may be used. In addition, the red, green and blue color filter materials having the photosensitive property may be a negative type in which a portion exposed to light remains after developing. Alternatively, the red, green and blue color filter materials having the photosensitive property may be a positive type in which a portion exposed to light is removed after developing.

It has been described that the color filter layer 330 is formed after forming the black matrix 320. However, the order of forming the black matrix 320 and the color filter layer 330 may be changed. For example, the color filter layer may be first formed, and then the black matrix may be formed.

Furthermore, preparations of the first substrate 210 of FIG. 4A and the second substrate 310 of FIG. 4B are not limited to the order mentioned above, and the order may be changed.

Figure 4C:
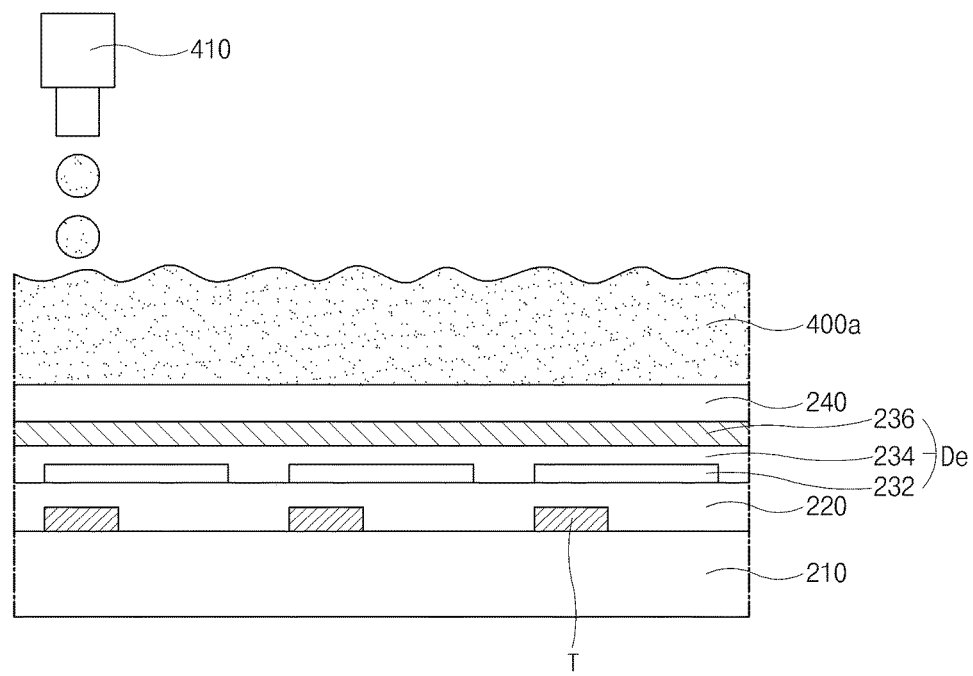

Next, in FIG. 4C, a seal pattern (not shown) is formed on the passivation layer 240 of the first substrate 210 by applying a sealing material along edges of the first substrate 210, and a filing layer 400a is formed on the passivation layer 240 in the seal pattern by applying a filling substance including a color conversion material using an injection apparatus 410. The filling substance may be applied in a dot shape.

Here, the sealing material may be a photo-curable material, and the filling substance may be a photo-curable material or a thermo-curable material. In addition, the sealing material may have relatively high viscosity, the filling substance may have relatively low viscosity, and the viscosity of the sealing material, beneficially, may be larger than the viscosity of the filling substance. For example, the viscosity of the sealing material may be 10000 cp to 30000 cp, and the viscosity of the filling substance may be less than 1000 cp.

Figure 4D:
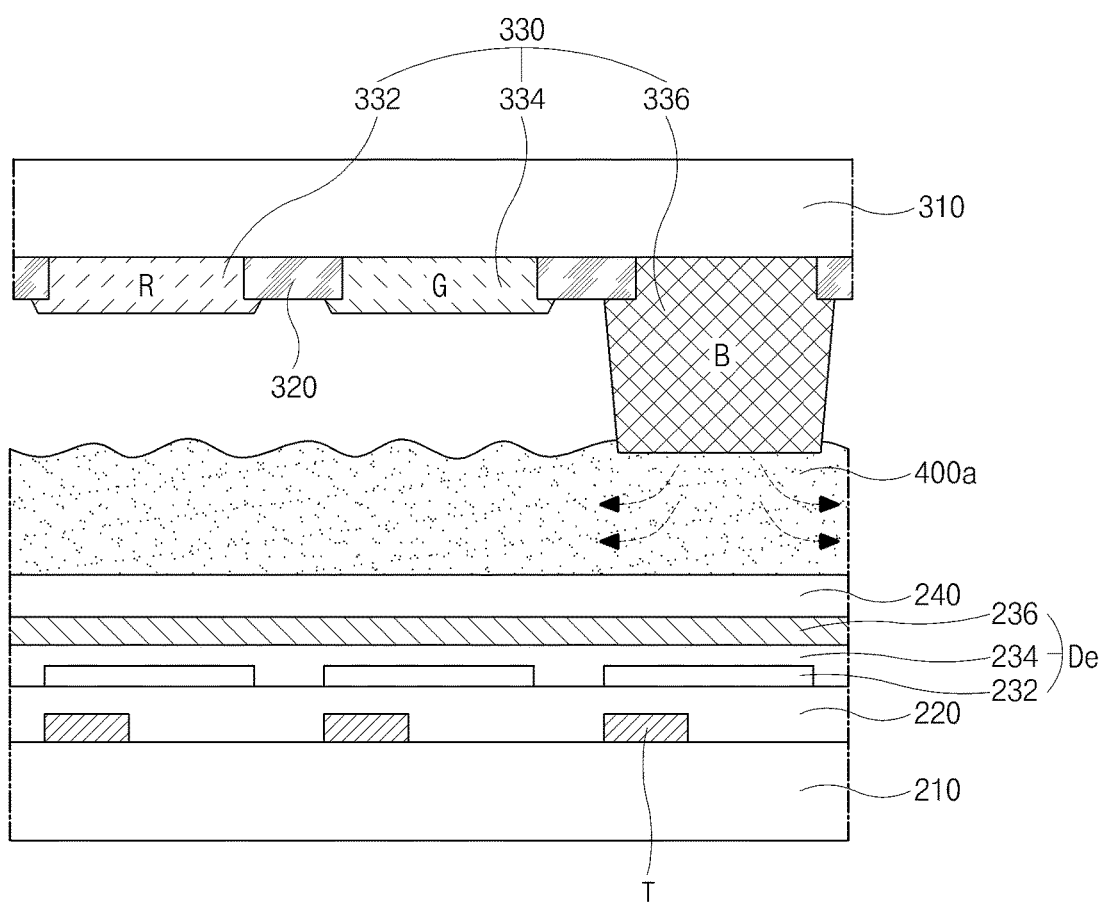

Next, in FIG. 4D, the second substrate 310 of FIG. 4B is disposed over the first substrate 210, and a pressure is applied such that the first and second substrates 210 and 310 are close to each other. At this time, the blue color filter 336 presses the filling layer 400a, and a portion of the filling layer 400a corresponding to the blue color filter 336 moves into an adjacent area because of the pressing force of the blue color filter 336.

Here, the pressure is applied until the passivation layer 240 of the first substrate 210 and the blue color filter 336 of the second substrate 310 contact each other, and the filling layer 400a is filled between the passivation layer 240 of the first substrate 210 and the red and green color filters 332 and 334 of the second substrate 310.

Figure 4E:
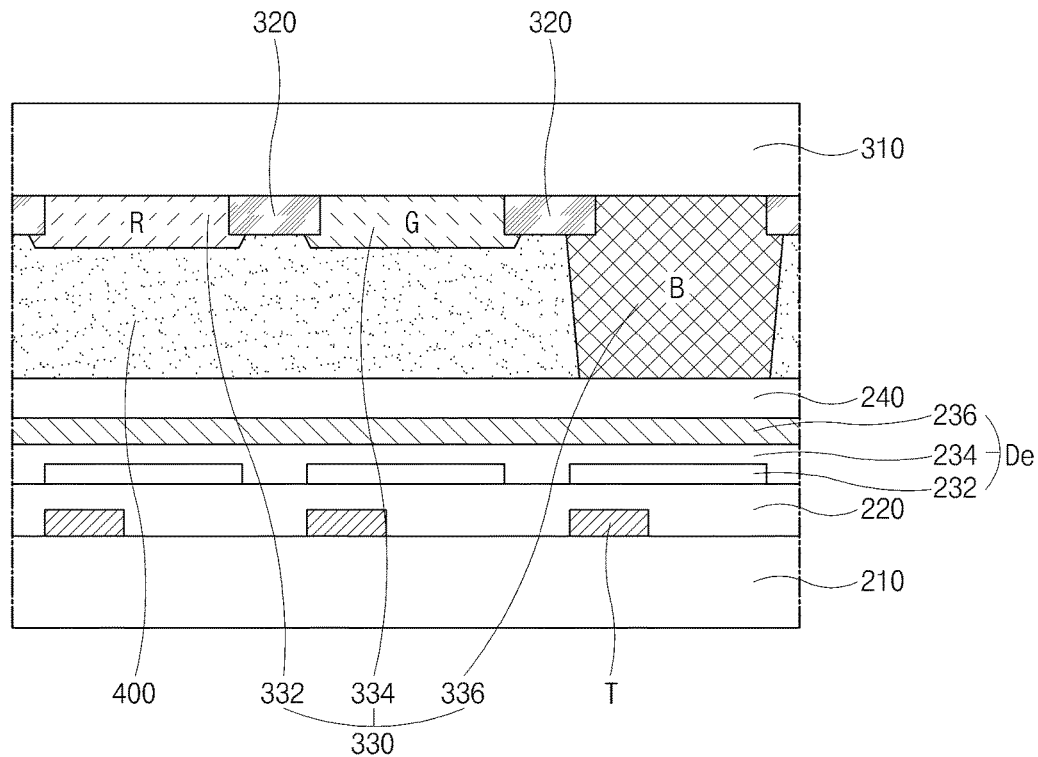

Next, in FIG. 4E, a color changing layer 400 is formed by curing the filling layer 400a of FIG. 4D between the passivation layer 240 and the red and green color filters 332 and 334 using light or heat. Here, a step of hardening the sealing material by irradiating UV may be performed before curing the filling layer 400a of FIG. 4D.

Meanwhile, the color changing layer 400, beneficially, may not be formed between the blue color filter 336 and the passivation layer 240. However, the color changing layer 400 with a relatively very thin thickness may be formed between the blue color filter 336 and the passivation layer 240 according to a coating amount of the filling layer 400a of FIG. 4D. To prevent the efficiency of blue light (B) in the blue sub-pixel from being lowered, it may be beneficial that the thickness of the color changing layer 400 between the blue color filter 336 and the passivation layer 240 is equal to or less than 1 micrometer.

According to the first example embodiment of the present disclosure, the color changing layer 400 may be formed without an additional patterning process. Therefore, the manufacturing processes may be simplified, and the manufacturing time and costs may be decreased.

FIGS. 5A to 5D are cross-sectional views illustrating a method of fabricating an OLED display device according to a second example embodiment of the present disclosure.

Figure 5A:
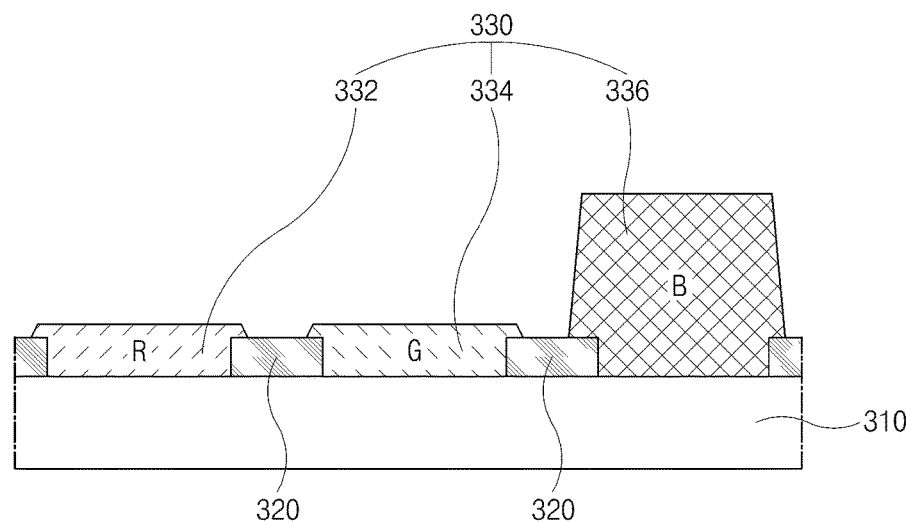
FIGS. 5A to 5D are cross-sectional views illustrating a method of manufacturing an OLED display device according to a second example embodiment of the present disclosure.

In FIG. 5A, a second substrate 310 is prepared on which a black matrix 320 and a color filter layer 330.

For example, a light-blocking material layer (not shown) is formed on the second substrate 310 and is patterned through a photolithography process to thereby form the black matrix 320 having openings corresponding to the respective sub-pixels. Here, the light-blocking material layer may include a black resin or may include double layers of chromium oxide (CrOx) and chromium (Cr). Next, a red color filter 332 is formed in a red sub-pixel by applying a first color filter material having a photosensitive property, for example, a red color filter material, over substantially all the second substrate 310 on the black matrix 320, drying the red color filter material, light-exposing the red color filter material using a mask, developing the red color filter material, and curing the red color filter material. Then, a green color filter 334 is formed in a green sub-pixel by applying a second color filter material having a photosensitive property, for example, a green color filter material, over substantially all the second substrate 310 on the black matrix 320 and the red color filter 332, drying the green color filter material, light-exposing the green color filter material using a mask, developing the green color filter material, and curing the green color filter material. Next, a blue color filter 336 is formed in a blue sub-pixel by applying a third color filter material having a photosensitive property, for example, a blue color filter material, over substantially all the second substrate 310 on the black matrix 320, the red color filter 332 and the green color filter 334, drying the blue color filter material, light-exposing the blue color filter material using a mask, developing the blue color filter material, and curing the blue color filter material. Accordingly, the color filter layer 330 including the red, green and blue color filters 332, 334 and 336 is completed. However, the formation order of the red, green and blue color filters 332, 334 and 336 may be changed. It may be beneficial that a thickness of the blue color filter 336 is larger than thicknesses of the red and green color filters 332 and 334.

Here, the red, green and blue color filter materials may be applied by a coating method, and for example, one of a spin coating method, a slit coating method, a bar coating method, a roll coating method, an inkjet coating method may be used. In addition, the red, green and blue color filter materials having the photosensitive property may be a negative type in which a portion exposed to light remains after developing. Alternatively, the red, green and blue color filter materials having the photosensitive property may be a positive type in which a portion exposed to light is removed after developing.

In the meantime, it is described that the color filter layer 330 is formed after forming the black matrix 320. However, the order of forming the black matrix 320 and the color filter layer 330 may be changed. For example, the color filter layer may be first formed, and then the black matrix may be formed.

Figure 5B:
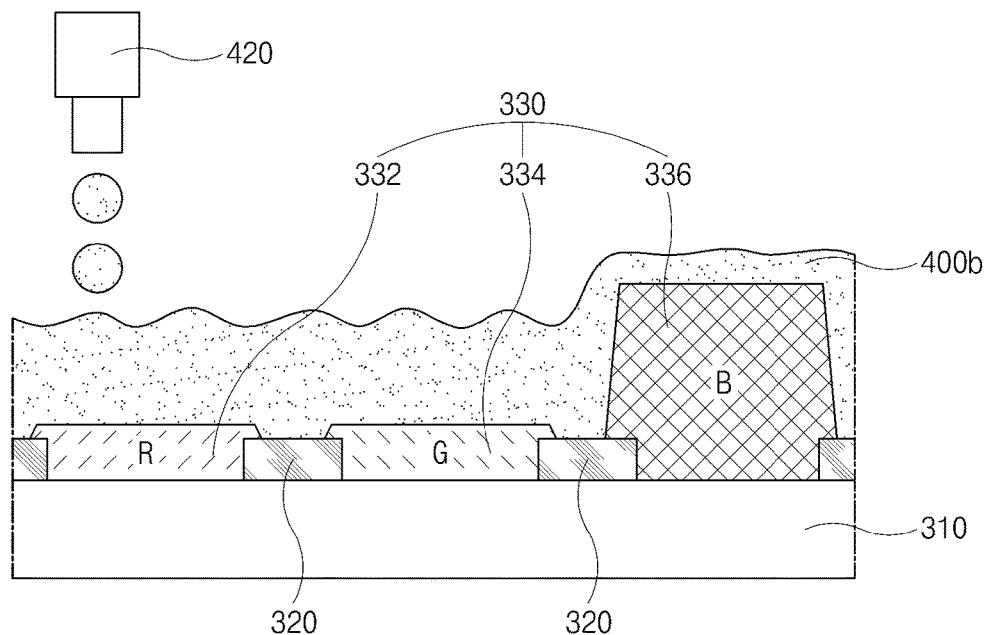

Next, in FIG. 5B, a seal pattern (not shown) is formed on the second substrate 310 by applying a sealing material along edges of the second substrate 310, and a filing layer 400b is formed on the color filter layer 330 in the seal pattern by applying a filling substance including a color conversion material using an injection apparatus 420. The filling substance may be applied in a dot shape.

Here, the sealing material may be a photo-curable material, and the filling substance may be a photo-curable material or a thermo-curable material. In addition, the sealing material may have relatively high viscosity, the filling substance may have relatively low viscosity, and the viscosity of the sealing material, beneficially, may be larger than the viscosity of the filling substance. For example, the viscosity of the sealing material may be 10000 cp to 30000 cp, and the viscosity of the filling substance may be less than 1000 cp.

Meanwhile, before or after the preparation of the second substrate 310 of FIG. 5A, as shown in FIG. 4A, a first substrate 210 of FIG. 4A is prepared on which thin film transistors T of FIG. 4A, an insulating layer 220 of FIG. 4A, organic light-emitting diodes De of FIG. 4A, and a passivation layer 240 of FIG. 4A are formed.

Figure 5C:
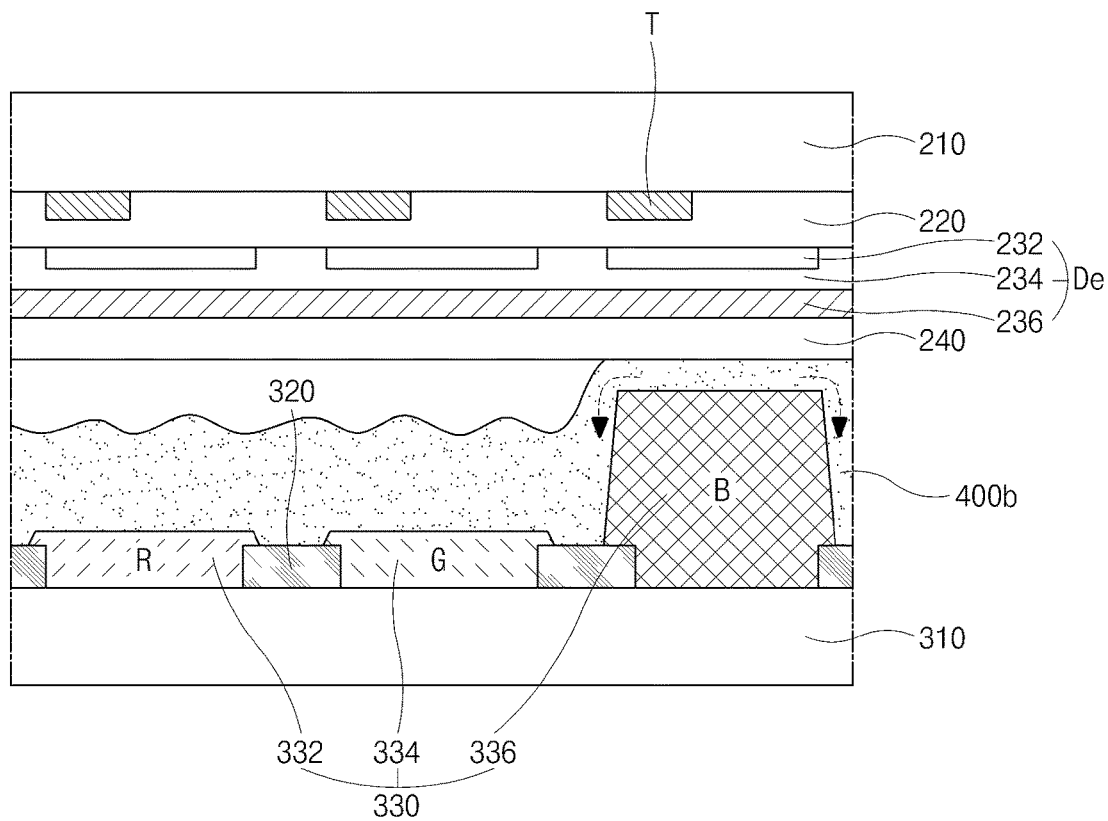

Next, in FIG. 5C, the first substrate 210 of FIG. 4A is disposed over the second substrate 310, and a pressure is applied such that the first and second substrates 210 and 310 are close to each other. At this time, the passivation layer 240 of the first substrate 210 presses the filling layer 400b, and a portion of the filling layer 400b on the blue color filter 336 moves into an adjacent area because of the pressing force of the passivation layer 240.

Here, the pressure is applied until the passivation layer 240 of the first substrate 210 and the blue color filter 336 of the second substrate 310 contact each other, and the filling layer 400b is filled between the passivation layer 240 of the first substrate 210 and the red and green color filters 332 and 334 of the second substrate 310.

Figure 5D:
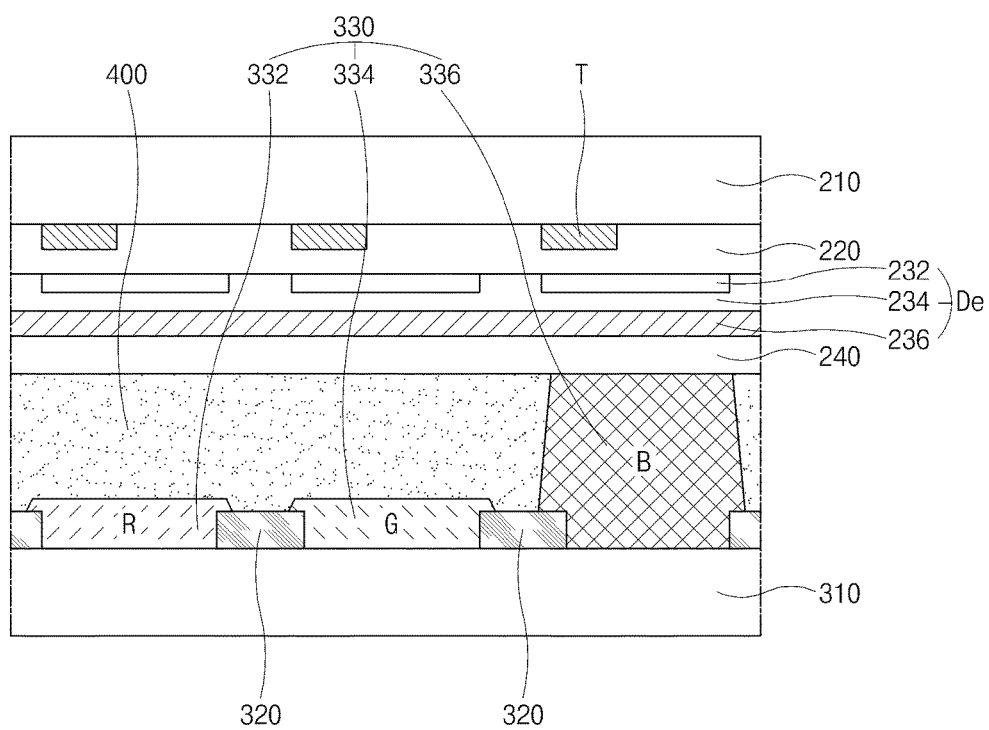

Next, in FIG. 5D, a color changing layer 400 is formed by curing the filling layer 400b of FIG. 5C between the passivation layer 240 and the red and green color filters 332 and 334 using light or heat. Here, a step of hardening the sealing material by irradiating UV may be performed before curing the filling layer 400b of FIG. 5C.

Meanwhile, the color changing layer 400, beneficially, may not be formed between the blue color filter 336 and the passivation layer 240. However, the color changing layer 400 with a relatively very thin thickness may be formed between the blue color filter 336 and the passivation layer 240 according to a coating amount of the filling layer 400b of FIG. 5C. To prevent the efficiency of blue light (B) in the blue sub-pixel from being lowered, it may be beneficial that the thickness of the color changing layer 400 between the blue color filter 336 and the passivation layer 240 is equal to or less than 1 micrometer.

According to the second example embodiment of the present disclosure, the color changing layer 400 may be formed without an additional patterning process. Therefore, the manufacturing processes may be simplified, and the manufacturing time and costs may be decreased.

It will be apparent to those skilled in the art that various modifications and variations may be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light-emitting diode display device, comprising:
a first substrate;
organic light-emitting diodes each including a first electrode, an organic light-emitting layer, and a second electrode on the first substrate;
a passivation layer on the organic light-emitting diodes;
a second substrate spaced apart from the first substrate;
a color filter layer on an inner surface of the second substrate; and
a single color changing layer contacting the passivation layer and the color filter layer,
wherein the color filter layer includes first, second, and third color filters, and the single color changing layer has a wider width than each of the first and second color filters and overlaps both the first and second color filters.

2. The display device of claim 1, wherein the single color changing layer absorbs blue light and emits yellow light therefrom.

3. The display device of claim 2, wherein the color filter layer includes red, green, and blue color filters, the single color changing layer overlaps the red and green color filters, and a thickness of the blue color filter is larger than a thickness of the red or green color filter.

4. The display device of claim 3, wherein the single color changing layer is disposed between the red and green color filters and the passivation layer.

5. The display device of claim 4, wherein the thickness of the blue color filter is equal to a sum of the thickness of the red or green color filter and a thickness of the single color changing layer.

6. The display device of claim 5, wherein the thickness of the blue color filter is 3.5 times to 5 times the thickness of the red or green color filter.

7. The display device of claim 6, wherein the red and green color filters have the same thickness.

8. The display device of claim 3, wherein the color filter layer further includes a white color filter, and a thickness of the white color filter is equal to the thickness of the blue color filter.

9. The display device of claim 1, wherein the single color changing layer is between the passivation layer and the color filter layer.

10. The display device of claim 1, wherein the single color changing layer contacts a side surface of the third color filter.

11. The display device of claim 1, wherein a black matrix is disposed between the first and second color filters, and the single color changing layer overlaps the black matrix.

12. An organic light-emitting diode display device, comprising:
 a first substrate;
 organic light-emitting diodes each including a first electrode, an organic light-emitting layer, and a second electrode on the first substrate;
 a passivation layer on the organic light-emitting diodes;
 a second substrate spaced apart from the first substrate;
 a color filter layer on an inner surface of the second substrate and including red, green, and blue color filters; and
 a single color changing layer disposed between the red and green color filters and the passivation layer, the single color changing layer absorbing blue light and emitting yellow light therefrom,
 wherein the single color changing layer contacts a side surface of the blue color filter, and
 wherein a bottom surface of the blue color filter contacts the passivation layer.

13. The display device of claim 12, wherein the single color changing layer contacts the passivation layer.

14. The display device of claim 12, wherein a thickness of the blue color filter is 3.5 times to 5 times the thickness of the red or green color filter.

15. The display device of claim 14, wherein the color filter layer further includes a white color filter, and a thickness of the white color filter equals to the thickness of the blue color filter.

16. The display device of claim 12, wherein a black matrix is disposed between the red and green color filters, and the single color changing layer overlaps the red and green color filters and the black matrix.

17. A method of fabricating an organic light-emitting diode display device, comprising:
 preparing a first substrate including organic light-emitting diodes and a passivation layer on the organic light-emitting diodes;
 preparing a second substrate including a color filter layer;
 forming a filling layer on one of the first and second substrates by applying a filling substance including a color conversion material;
 attaching the first and second substrates with the filling layer therebetween; and
 forming a single color changing layer by curing the filling layer between the first and second substrates, the single color changing layer contacting the passivation layer and the color filter layer,
 wherein the color filter layer includes first, second, and third color filters, and the single color changing layer has a wider width than each of the first and second color filters and overlaps both the first and second color filters.

18. The method of claim 17, wherein preparing the second substrate includes forming red, green, and blue color filters, and
 wherein the single color changing layer overlaps the red and green color filters, and a thickness of the blue color filter is thicker than a thickness of the red or green color filter.

19. The method of claim 18, wherein attaching the first and second substrates includes applying a pressure until the blue color filter and the passivation layer contact each other.

20. The method of claim 17, wherein the organic light-emitting diode display device comprises:
 the first substrate;
 the organic light-emitting diodes each including a first electrode, an organic light-emitting layer, and a second electrode on the first substrate;
 the passivation layer on the organic light-emitting diodes;
 the second substrate spaced apart from the first substrate;
 the color filter layer on an inner surface of the second substrate; and
 the single color changing layer contacting the passivation layer and the color filter layer.

21. The method of claim 17, wherein the single color changing layer contacts a side surface of the third color filter.

22. The method of claim 17, wherein a black matrix is disposed between the first and second color filters, and the single color changing layer overlaps the black matrix.

* * * * *